(12) United States Patent
Kawamura et al.

(10) Patent No.: US 10,197,460 B2
(45) Date of Patent: Feb. 5, 2019

(54) PIEZOELECTRIC SENSOR INCLUDING A SENSOR UNIT HAVING A FIRST ADHESIVE LAYER WITH DIFFERENT PROPERTIES THAN A SECOND ADHESIVE LAYER

(71) Applicant: Murata Manufacturing Co., Ltd., Nagaokakyo-shi, Kyoto-fu (JP)

(72) Inventors: Hideki Kawamura, Nagaokakyo (JP); Hiroyuki Nakaji, Nagaokakyo (JP); Yoshihiro Yamaguchi, Nagaokakyo (JP); Jun Endo, Nagaokakyo (JP); Masato Saito, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 251 days.

(21) Appl. No.: 15/196,723

(22) Filed: Jun. 29, 2016

(65) Prior Publication Data

US 2016/0305832 A1 Oct. 20, 2016

Related U.S. Application Data

(63) Continuation of application No. PCT/JP2015/050109, filed on Jan. 6, 2015.

(30) Foreign Application Priority Data

Jan. 20, 2014 (JP) .................................. 2014-007345

(51) Int. Cl.
*H01L 41/113* (2006.01)
*G01L 1/16* (2006.01)
(Continued)

(52) U.S. Cl.
CPC .............. *G01L 1/16* (2013.01); *H01L 41/053* (2013.01); *H01L 41/1132* (2013.01);
(Continued)

(58) Field of Classification Search
CPC ......... G01L 1/16; G01L 5/167; H01L 41/053; H01L 41/193; H01L 41/1138;
(Continued)

(56) References Cited

U.S. PATENT DOCUMENTS 4,701,659 A * 10/1987 Fujii ..................... B06B 1/0688
310/334
5,994,161 A * 11/1999 Bitko .................... B81B 7/0012
438/50
(Continued)

FOREIGN PATENT DOCUMENTS

JP 2011222679 A 11/2011
WO WO 2011125408 A1 10/2011

OTHER PUBLICATIONS

WO 2015098723; Endo J; Kawamura H ; Nakaji H ; Saito M ; Yamaguchi Y; Method for manufacturing piezoelectric sensor for display apparatus of e.g. smart phone, involves pressing substrate portion and pushing element in state in which piezoelectric film is arranged; Priority-Data: 2013JP-265457 (Dec. 24, 2013).*
(Continued)

*Primary Examiner* — Harshad R Patel
*Assistant Examiner* — Brandi N Hopkins
(74) *Attorney, Agent, or Firm* — Arent Fox LLP

(57) ABSTRACT

A piezoelectric sensor that includes a piezoelectric film, first and second adhesive layers, first and second plate electrodes and a glass plate. The piezoelectric film includes first and second principal surfaces. The first adhesive layer attaches the first plate electrode to the first principal surface. The second adhesive layer attaches the second plate electrode to the second principal surface. The second plate electrode is attached to the glass plate such that the second adhesive layer and the second plate electrode are interposed between the piezoelectric film and the glass plate. The glass plate is
(Continued)

distorted by being pushed. The second adhesive layer is thicker than the first adhesive layer.

21 Claims, 3 Drawing Sheets

(51) Int. Cl.
 H01L 41/053 (2006.01)
 H01L 41/193 (2006.01)
 H01L 41/313 (2013.01)
(52) U.S. Cl.
 CPC .......... H01L 41/193 (2013.01); H01L 41/313 (2013.01); H01L 41/1138 (2013.01)
(58) Field of Classification Search
 CPC . H01L 41/0533; H01L 41/1132; H01L 41/08; Y10S 977/742; Y10S 977/762; Y10S 977/956; B82Y 15/00; C09J 133/00; C09J 201/00
 See application file for complete search history.

(56) References Cited

U.S. PATENT DOCUMENTS

| | | | | |
|---|---|---|---|---|
| 9,333,725 | B2* | 5/2016 | Chuang | ........................ C09J 5/06 |
| 2009/0026881 | A1* | 1/2009 | Erturk | ..................... F04D 33/00 |
| | | | | 310/311 |
| 2013/0086997 | A1* | 4/2013 | Tanhua | ..................... G01L 1/16 |
| | | | | 73/862.541 |
| 2014/0049137 | A1* | 2/2014 | Ando | ...................... G01B 7/16 |
| | | | | 310/330 |
| 2014/0050874 | A1* | 2/2014 | Takeda | .................. C09J 123/16 |
| | | | | 428/41.3 |
| 2014/0144685 | A1* | 5/2014 | Ho | ........................ H05K 3/281 |
| | | | | 174/258 |

OTHER PUBLICATIONS

International Search Report issued for PCT/JP2015/050109, dated Feb. 3, 2015.
Written Opinion of the International Searching Authority issued for PCT/JP2015/050109, dated Feb. 3, 2015.

* cited by examiner

PIEZOELECTRIC SENSOR INCLUDING A SENSOR UNIT HAVING A FIRST ADHESIVE LAYER WITH DIFFERENT PROPERTIES THAN A SECOND ADHESIVE LAYER

CROSS REFERENCE TO RELATED APPLICATIONS

The present application is a continuation of International application No. PCT/JP2015/050109, filed Jan. 6, 2015, which claims priority to Japanese Patent Application No. 2014-007345, filed Jan. 20, 2014, the entire contents of each of which are incorporated herein by reference.

FIELD OF THE INVENTION

The present invention relates to a piezoelectric sensor which detects a press.

BACKGROUND OF THE INVENTION

A piezoelectric sensor is, for example, mounted on a multifunction mobile terminal, and detects a press on a touch panel. A conventional piezoelectric sensor is, for example, a transparent piezoelectric sheet disclosed in Patent Literature 1. This transparent piezoelectric sheet includes a piezoelectric film, adhesive layers and plate electrodes. The plate electrodes are disposed on both principal surfaces of the piezoelectric film with the adhesive layers interposed therebetween. When this transparent piezoelectric sheet is pressed, a voltage corresponding to the press is produced in the piezoelectric film. By transmitting this voltage from the plate electrodes to a detection circuit, it is possible to detect a press.

PTL 1: Japanese Patent Application Laid Open No. 2011-222679

SUMMARY OF THE INVENTION

The transparent piezoelectric sheet disclosed in Patent Literature 1 is concerned that the plate electrodes hinder deformation of the piezoelectric film depending on piezoelectric characteristics of the piezoelectric film, and therefore the piezoelectric film does not produce a sufficient voltage. In this case, it is not possible to precisely detect a press to be applied to the transparent piezoelectric sheet.

An object of the present invention is to provide a piezoelectric sensor which can precisely detect a press.

A piezoelectric sensor according to the present invention includes a piezoelectric film, first and second plate electrodes, first and second adhesive layers, and a plate member. The piezoelectric film includes first and second principal surfaces. The first adhesive layer attaches the first plate electrode to the first principal surface. The second adhesive layer attaches the second plate electrode to the second principal surface. The piezoelectric film is attached on the plate member with the second plate electrode and the second adhesive layer interposed therebetween. The plate member is distorted by being pushed. The first adhesive layer is thicker than the second adhesive layer.

When the first adhesive layer is thin, the first plate electrode attached to the piezoelectric film hinders deformation of the piezoelectric film. When the second adhesive layer is thick, a strain of the plate member is alleviated by the second adhesive layer. By making the first adhesive layer thicker than the second adhesive layer, the strain of the plate member is readily transmitted to the piezoelectric film.

Further, the first adhesive layer is thicker than the second adhesive layer, so that, when a working temperature becomes high, the second adhesive layer is softened and the first adhesive layer is softened more. Thus, a decrease in a sensor output caused by softening the second adhesive layer and an increase in a sensor output caused by softening the first adhesive layer cancel each other. Consequently, it is possible to suppress a fluctuation of the sensor output caused by the working temperature. As a result, temperature characteristics of the piezoelectric sensor improve.

Consequently, according to this configuration, it is possible to precisely detect a press.

A thickness of the first adhesive layer is preferably 40 µm or less. When the first adhesive layer is too thick, a distance between the first plate electrode and the piezoelectric film becomes long. Therefore, when the piezoelectric film is distorted, a charge amount which can be extracted from the piezoelectric film decreases. According to this configuration, it is possible to extract a sufficient charge amount from the piezoelectric film.

A modulus of the first adhesive layer is preferably lower than a modulus of the second adhesive layer. When the first adhesive layer has a high modulus, the first plate electrode attached to the piezoelectric film hinders deformation of the piezoelectric film. When the second adhesive layer has a low modulus, a strain of the plate member is alleviated by the second adhesive layer. According to this configuration, it is possible to easily transmit the strain of the plate member to the piezoelectric film.

A material of the first adhesive layer is preferably an acrylic pressure sensitive adhesive. According to this configuration, it is possible to make the modulus of the first adhesive layer low.

The piezoelectric film is made of a chiral polymer. Preferably, the chiral polymer is polylactic acid. Most preferably, the polylactic acid is poly-L-lactic acid.

For example, there is a concern that, when PVDF (polyvinylidene fluoride) is used for the piezoelectric film, a change in the working temperature influences piezoelectric characteristic of the piezoelectric film.

However, according to this configuration, polylactic acid does not have pyroelectricity, so that the piezoelectric film can precisely detect a press.

According to the present invention, it is possible to precisely detect a press.

DETAILED DESCRIPTION OF THE INVENTION

First Embodiment

Figure 1:
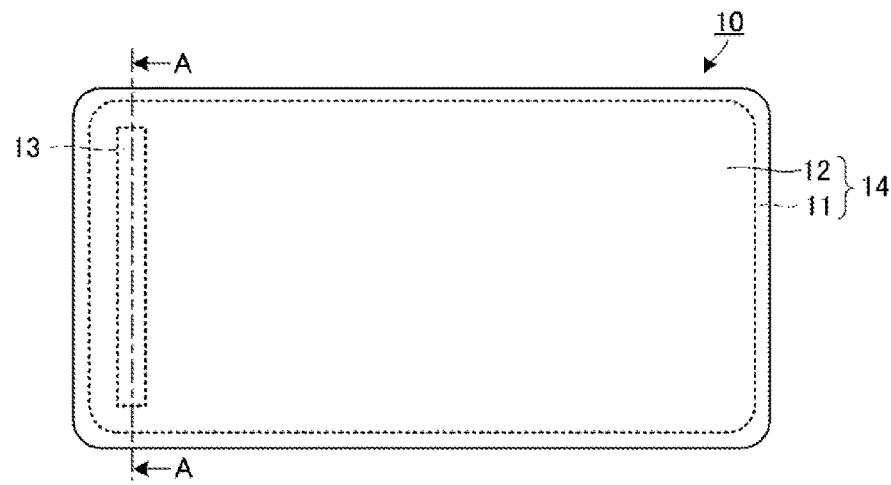
FIG. 1 is a plan view of a piezoelectric sensor according to a first embodiment.
Figure 1:
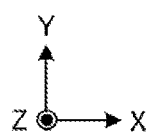
Figure 2:
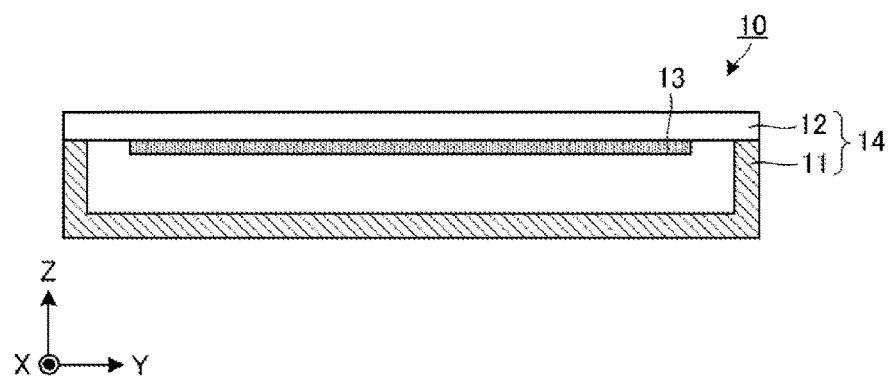
FIG. 2 is an A-A sectional view of the piezoelectric sensor according to the first embodiment.
Figure 2:
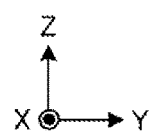

A piezoelectric sensor 10 according to the first embodiment of the present invention will be described. The piezoelectric sensor 10 is used by, for example, a multifunction mobile terminal. FIG. 1 is a plan view of the piezoelectric sensor 10. FIG. 2 is an A-A sectional view of the piezoelectric sensor 10. The piezoelectric sensor 10 includes a back side housing unit 11 of a box shape, a glass plate 12 of a rectangular flat shape, a sensor unit 13 of a stripe shape and a circuit unit (not illustrated). The back side housing unit 11 is formed by side surfaces of frame shapes and a bottom surface of a rectangular shape, and includes an opening of a rectangular shape. The glass plate 12 is placed in contact with the back side housing unit 11 to block the opening of the back side housing unit 11 in order to form a housing 14 of a cuboid shape including a hollow portion. The sensor unit 13 is attached to the glass plate 12 by a pressure sensitive adhesive such that the sensor unit 13 is disposed inside the housing 14. The sensor unit 13 is disposed at an end portion of the glass plate 12 in a longitudinal direction when seen from a plan view. The longitudinal direction of the sensor unit 13 is parallel to a lateral direction of the glass plate 12. The circuit unit is disposed inside the housing 14, and is electrically connected to the sensor unit 13. Hereinafter, a longitudinal direction of a principal surface of the housing 14 will be optionally referred to as an X direction, the lateral direction of the principal surface of the housing 14 will be referred optionally to as a Y direction, and a direction vertical to the principal surface of the housing 14 will be optionally referred to as a Z direction.

Figure 3:
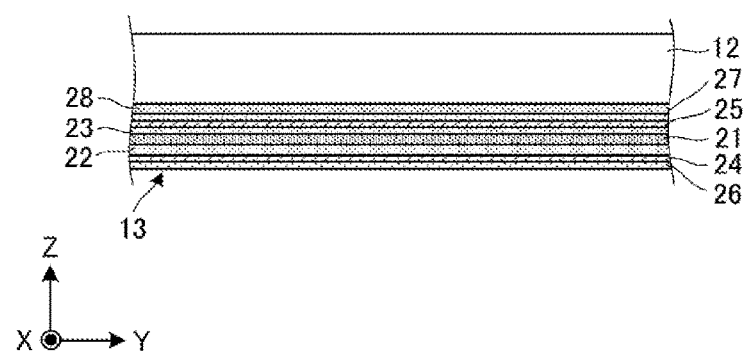
FIG. 3 is an A-A sectional view of a sensor unit 13.
Figure 3:
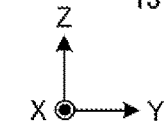

FIG. 3 is an A-A sectional view of the sensor unit 13. The sensor unit 13 includes a piezoelectric film 21, adhesive layers 22 and 23, plate electrodes 24 and 25 and base material layers 26 and 27. The plate electrode 24 is disposed on a first principal surface of the piezoelectric film 21 with the adhesive layer 22 interposed therebetween. The adhesive layer 22 attaches the plate electrode 24 to the first principal surface of the piezoelectric film 21. The plate electrode 25 is disposed on a second principal surface of the piezoelectric film 21 with the adhesive layer 23 interposed therebetween. The adhesive layer 23 attaches the plate electrode 25 to the second principal surface of the piezoelectric film 21. The plate electrodes 24 and 25 are electrically connected to the circuit unit (not illustrated). The adhesive layer 22 is thicker than the adhesive layer 23. Preferably, the thickness of the adhesive layer 22 is 30 μm, and the thickness of the adhesive layer 23 is 10 μm. Thus, as described below, a strain of the glass plate 12 caused by a press (push) is readily transmitted to the piezoelectric film 21. On a principal surface at an opposite side to the piezoelectric film 21 among the principal surfaces of the plate electrode 24, the base material layer 26 is disposed. On a principal surface at an opposite side to the piezoelectric film 21 among the principal surfaces of the plate electrode 25, the base material layer 27 is disposed. The sensor unit 13 is disposed on a principal surface of the glass plate 12 with an adhesive layer 28 interposed therebetween such that the base material layer 27 side is directed toward the glass plate 12. That is, the adhesive layer 22 is disposed on the piezoelectric film 21 and at an opposite side to the glass plate 12, and the adhesive layer 23 is disposed on the piezoelectric film 21 and near the glass plate 12. The sensor unit 13 is attached to the principal surface of the glass plate 12 by the adhesive layer 28. A thickness of the adhesive layer 28 is, for example, 30 μm.

The glass plate 12 corresponds to the plate member of the present invention. The adhesive layer 22 corresponds to the first adhesive layer of the present invention. The adhesive layer 23 corresponds to the second adhesive layer of the present invention. The plate electrode 24 corresponds to the first plate electrode of the present invention. The plate electrode 25 corresponds to the second plate electrode of the present invention.

A material of the piezoelectric film 21 is PLLA (poly-L-lactic acid). Such PLLA is made of a chiral polymer and has a main chain which adopts a spiral structure. The PLLA has piezoelectricity when the PLLA is uniaxially stretched and molecules are oriented. A piezoelectric constant of the uniaxially stretched PLLA belongs to a group of very high piezoelectric constants among polymers.

Further, the PLLA exhibits piezoelectricity as a result of molecular orientation treatment by stretching, and does not need to be subjected to poling treatment unlike other polymers such as PVDF or piezoelectric ceramic. That is, the piezoelectricity of the PLLA which does not belong to ferroelectrics is exhibited not by ion polarization as in ferroelectrics such as PVDF or PZT, but derives from a spiral structure which is a characteristic structure of molecules. Further, the PLLA does not exhibit pyroelectricity unlike other ferroelectric piezoelectric bodies. Furthermore, although PVDF fluctuates in a piezoelectric constant with time and the piezoelectric constant significantly lowers in some cases, a piezoelectric constant of the PLLA is very stable over time.

When a third axis is arranged in a PLLA stretching direction, and a first axis and a second axis are arranged in a direction vertical to a third axis direction, PLLA has a piezoelectric constant of $d_{14}$ (shear piezoelectric constant). The piezoelectric film 21 of a stripe shape is cut such that a first axis direction is a thickness direction, and a direction which forms an angle of 45° with respect to the third axis direction (stretching direction) is the longitudinal direction. Thus, when the piezoelectric film 21 is stretched and contracted in the longitudinal direction, the piezoelectric film 21 is polarized in the thickness direction.

A material of the adhesive layers 22, 23 and 28 is a pressure sensitive adhesive. A feature of the pressure sensitive adhesive is that, while an adhesive changes from a liquid to a solid upon adhesion, the adhesive stably keeps a wet state at all times. By using the pressure sensitive adhesive for the material of the adhesive layers 22, 23 and 28, it is possible to easily control the thickness of the pressure sensitive adhesive compared to the adhesive. A modulus of the adhesive layer 22 is lower than a modulus of the adhesive layer 23. Particularly, the material of the adhesive layer 22 is preferably an acrylic pressure sensitive adhesive. A material of the adhesive layers 23 and 28 is preferably a rubber, silicon or polyethylene pressure sensitive adhesive. Thus, as described below, a strain of the glass plate 12 caused by a press is readily transmitted to the piezoelectric film 21. The plate electrodes 24 and 25 are metal films such as copper foils. A material of the base material layers 26 and 27 is a resin such as polyimide.

Figure 4:
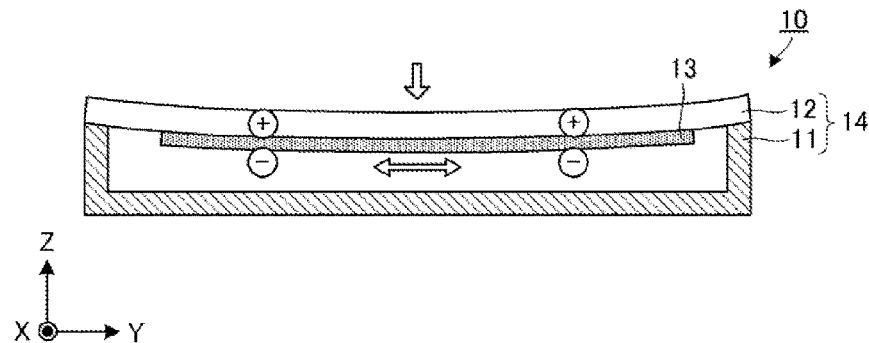
FIG. 4 is a sectional view for explaining press detection performed by the piezoelectric sensor according to the first embodiment.

FIG. 4 is a sectional view for explaining press detection performed by the piezoelectric sensor 10. When the glass plate 12 is pushed, an end portion of the glass plate 12 is fixed to the back side housing unit 11, and therefore the glass plate 12 is flexed to protrude in a direction in which the glass plate 12 is pushed. The principal surface at an inside of the housing 14 among the principal surfaces of the glass plate 12 stretches (is distorted), and therefore the sensor unit 13 attached to the principal surface stretches in the longitudinal direction (Y direction). The piezoelectric film 21 (see FIG. 3) forming the sensor unit 13 stretches in the longitudinal direction, and therefore a piezoelectric effect polarizes the piezoelectric film 21 in the thickness direction as described above. Charges produced in both of the principal surfaces of the piezoelectric film 21 induce charges in the plate electrodes 24 and 25. The charges induced in the plate electrodes 24 and 25 are absorbed by the circuit unit (not illustrated). The circuit unit converts a flow of these charges (current) into a voltage. Thus, it is possible to detect as a voltage a press to be applied to the glass plate 12.

Next, a relationship between the thicknesses and the material of the adhesive layers 22 and 23 (see FIG. 3), and a strain of the piezoelectric film 21 (a normal strain in the Y direction) will be described. When the adhesive layer 22 is thin, the plate electrode 24 attached to the piezoelectric film 21 constrains the piezoelectric film 21 and hinders deformation of the piezoelectric film 21. Hence, a strain of the glass plate 12 caused by a press is hardly transmitted to the piezoelectric film 21. Meanwhile, when the adhesive layer 23 is thick, the strain of the glass plate 12 caused by a press is alleviated by the adhesive layer 23, and therefore is hardly transmitted to the piezoelectric film 21. Consequently, from a viewpoint of a mechanical strain, it is possible to make the piezoelectric film 21 readily distort by making the adhesive layer 22 thick and making the adhesive layer 23 thin as described above.

When the adhesive layer 22 (23) is too thick, a distance between the plate electrode 24 (25) and the piezoelectric film 21 becomes long, and therefore a charge amount which can be extracted from the piezoelectric film 21 decreases. Further, fundamentally, the adhesive layer 23 is preferably as thin as possible. However, there are problems that availability of an adhesive tape whose thickness is 10 μm or less is practically poor, and an adhesive strength lowers and reliability lowers.

By taking into account these conditions, the thickness of the adhesive layer 22 is set to 40 μm or less as described above. Particularly, it is preferable to set the thickness of the adhesive layer 22 to 30 μm, and set the thickness of the adhesive layer 23 to 10 μm.

Figure 5:
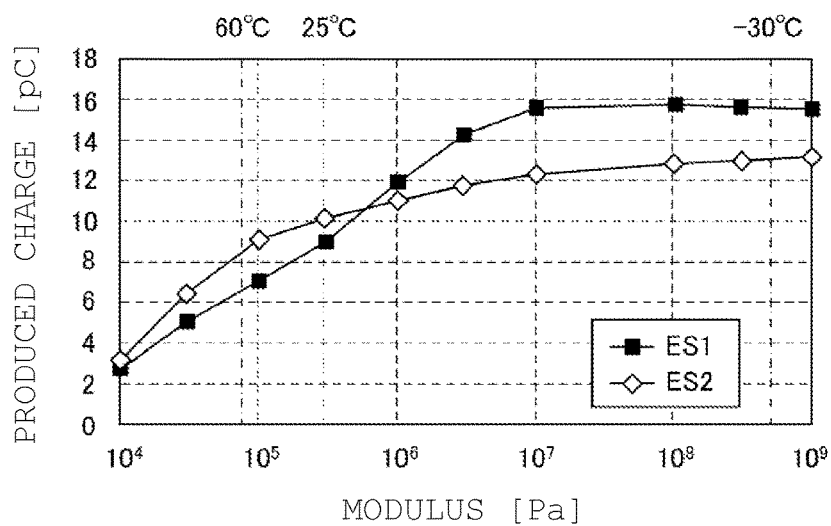
FIG. 5 is a graph illustrating produced charges with respect to moduli of adhesive layers 22 and 23.

FIG. 5 is a graph illustrating produced charges with respect to moduli of the adhesive layers 22 and 23. The produced charges are charges extracted from the piezoelectric film 21 when a predetermined press is applied to the piezoelectric sensor 10. In FIG. 5, an acrylic pressure sensitive adhesive is used for the material of the adhesive layers 22 and 23. According to a configuration ES1, both of the thicknesses of the adhesive layers 22 and 23 are 10 μm. According to a configuration ES2, the thickness of the adhesive layer 22 is 30 μm, and the thickness of the adhesive layer 23 is 10 μm. Further, FIG. 5 illustrates a correspondence relationship between working temperatures—30° C., 25° C. and 60° C. and the moduli of the adhesive layers 22 and 23. The working temperature −30° C. is an expected value of a lower limit of a working temperature range, the working temperature 60° C. is an expected value of an upper limit of the working temperature range and the working temperature 25° C. is an expected value of a room temperature.

According to both of the configurations ES1 and ES2, when the moduli of the adhesive layers 22 and 23 become high (the working temperature becomes low), produced charges are great. However, when the moduli of the adhesive layers 22 and 23 are $10^7$ or more, produced charges are substantially fixed. When the moduli of the adhesive layers 22 and 23 are high (the working temperature is low), produced charges according to the configuration ES1 are greater than produced charges according to the configuration ES2. When the moduli of the adhesive layers 22 and 23 are low (the working temperature is high), produced charges according to the configuration ES2 are greater than produced charges according to the configuration ES1.

At the room temperature (25° C.), produced charges according to the configuration ES2 are greater than produced charges according to the configuration ES1. That is, by making the adhesive layer 22 thicker than the adhesive layer 23, it is possible to improve sensor sensitivity at the room temperature.

Further, at around the room temperature, a temperature change rate of produced charges is low according to the configuration ES2 compared to the configuration ES1. That is, by making the adhesive layer 22 thicker than the adhesive layer 23, it is possible to suppress a fluctuation of produced charges caused by a working temperature.

Similar to the relationship between the thicknesses of the adhesive layers 22 and 23, when the adhesive layer 22 has a high modulus, the plate electrode 24 attached to the piezoelectric film 21 readily hinders deformation of the piezoelectric film 21. When the adhesive layer 23 has a low modulus, a strain of the glass plate 12 caused by a press is readily alleviated by the adhesive layer 23. Hence, as described above, by using an acrylic pressure sensitive adhesive for the adhesive layer 22 and using a rubber, silicone or polyethylene pressure sensitive adhesive for the adhesive layer 23, it is possible to make the piezoelectric film 21 readily distort.

Further, the adhesive layer 22 is thicker than the adhesive layer 23, so that, when a working temperature becomes high, the adhesive layer 23 is softened and the adhesive layer 22 is softened more. In addition, the solidness of an adhesive layer may be determined by a product of a thickness of the adhesive layer and a modulus of a material of the adhesive layer. Thus, a decrease in the sensor output (voltage) caused by softening the adhesive layer 23 and an increase in a sensor output caused by softening the adhesive layer 22 cancel each other. Consequently, as is clear from FIG. 5, too, a fluctuation of the sensor output caused by the working temperature is suppressed. As a result, it is possible to improve temperature characteristics of the piezoelectric sensor 10.

In the first exemplary embodiment, the adhesive layer 22 is thicker than the adhesive layer 23. Hence, as described below, a strain of the glass plate 12 caused by a press is readily transmitted to the piezoelectric film 21. Further, as described above, temperature characteristics of the piezoelectric sensor 10 improve. Consequently, according to the first exemplary embodiment, it is possible to precisely detect a press.

Second Embodiment

Figure 6:
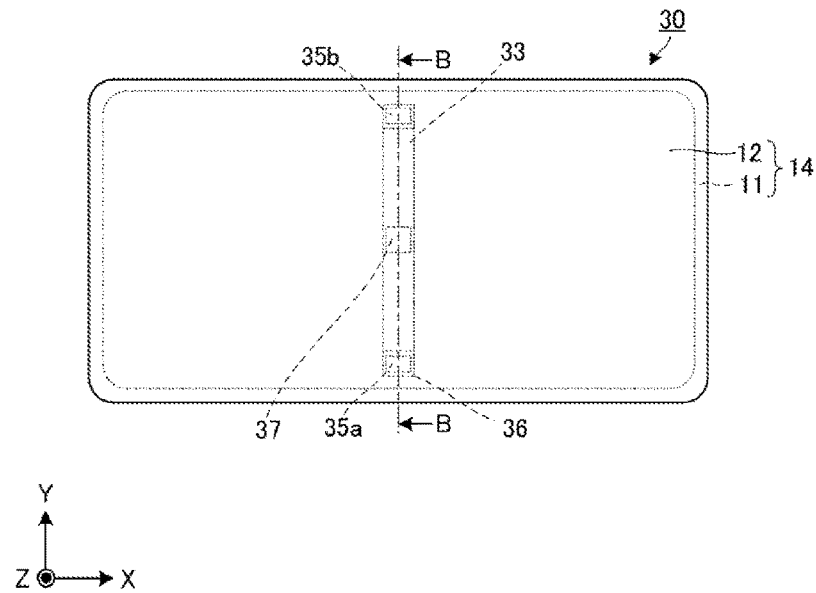
FIG. 6 is a plan view of a piezoelectric sensor according to a second embodiment.
Figure 7:
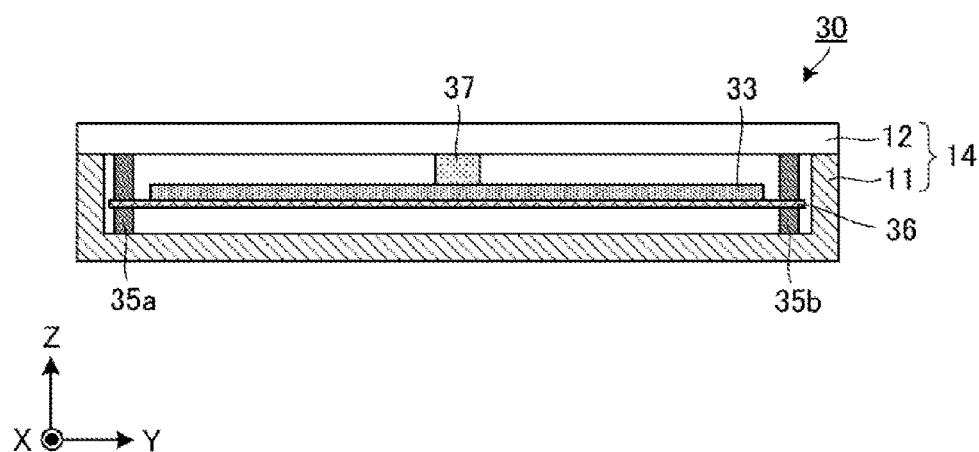
FIG. 7 is a B-B sectional view of the piezoelectric sensor according to the second embodiment.
Figure 8:
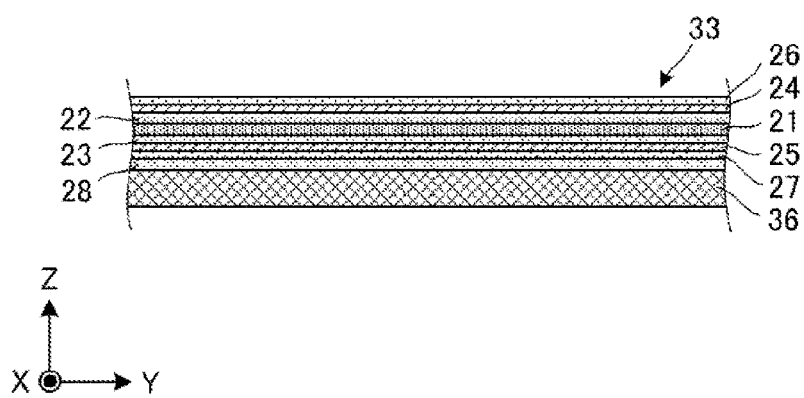
FIG. 8 is a B-B sectional view of a sensor unit 33.

A piezoelectric sensor 30 according to the second embodiment of the present invention will be described. FIG. 6 is a plan view of the piezoelectric sensor 30. FIG. 7 is a B-B sectional view of the piezoelectric sensor 30. FIG. 8 is a B-B sectional view of a sensor unit 33. The piezoelectric sensor 30 includes a back side housing unit 11, a glass plate 12, a sensor unit 33, spacers 35a and 35b, a SUS (stainless steel) plate 36 of a stripe shape, a plunger 37 of a columnar shape and a circuit unit (not illustrated). The SUS plate 36 corresponds to the plate member according to the present invention.

Similar to the first embodiment, the back side housing unit 11 and the glass plate 12 form a housing 14. The spacers 35a and 35b are disposed inside the housing 14. The spacer 35a is disposed close to a first side surface parallel to an X direction among side surfaces of the housing 14. The spacer 35b is disposed close to a second side surface (a side surface opposing to the first side surface) of the housing 14. The spacers 35a and 35b are disposed at a nearly center portion of the housing 14 in the X direction.

The SUS plate 36 is disposed inside the housing 14 such that a principal surface of the SUS plate 36 is parallel to a principal surface of the glass plate 12. The SUS plate 36 is disposed at a nearly center portion of the housing 14 in the X direction. The longitudinal direction of the SUS plate 36 is parallel to a Y direction. Both ends of the SUS plate 36 in the longitudinal direction are supported by the spacers 35a and 35b. Spacers are formed between the SUS plate 36 and the glass plate 12 and between the SUS plate 36 and a bottom surface of the back side housing unit 11.

The sensor unit 33 is attached to the principal surface at a side of the glass plate 12 among principal surfaces of the SUS plate 36 by a pressure sensitive adhesive such that the longitudinal direction is the Y direction. The circuit unit is disposed inside the housing 14, and is electrically connected to the sensor unit 33. The adhesive layer 22 (see FIG. 8) is disposed on the piezoelectric film 21 and at the side of the glass plate 12, and the adhesive layer 23 is disposed on the piezoelectric film 21 and at the side of the SUS plate. The adhesive layer 22 is thicker than the adhesive layer 23.

The plunger 37 is disposed between the glass plate 12 and the sensor unit 33, and is in contact with the glass plate 12 and the sensor unit 33. The plunger 37 is shorter than the sensor unit 33 in the Y direction. The plunger 37 is disposed at a nearly center portion of the SUS plate 36 in the Y direction.

The other components are the same as those in the first embodiment.

When the glass plate 12 is pushed, the SUS plate 36 is pushed via the plunger 37. The SUS plate 36 is flexed so as to protrude in a direction in which the SUS plate 36 is pushed. The principal surface at the side of the glass plate 12 among the principal surfaces of the SUS plate 36 is flexed, and therefore the piezoelectric film 21 attached to this principal surface contracts. The charges induced in the plate electrodes 24 and 25 by a piezoelectric effect are absorbed by a circuit unit (not illustrated). The circuit unit converts a flow of these charges (current) into a voltage. Thus, it is possible to detect as a voltage a press to be applied to the glass plate 12.

In the second exemplary embodiment, the adhesive layer 22 is thicker than the adhesive layer 23 similar to the first embodiment. Hence, a strain of the SUS plate 36 caused by a press is readily transmitted to the piezoelectric film 21. Further, temperature characteristics of the piezoelectric sensor 30 improve. As a result, according to the second exemplary embodiment, it is possible to precisely detect a press.

In addition, the glass plate is pushed in the above embodiments. However, the piezoelectric sensor according to the present invention is not limited to this. Instead of the glass plate, a panel on which a glass plate, a touch panel and a liquid crystal panel are stacked may be used.

DESCRIPTION OF REFERENCE SYMBOLS 10, 30: PIEZOELECTRIC SENSOR
11: BACK SIDE HOUSING UNIT
12: GLASS PLATE (PLATE MEMBER)
13, 33: SENSOR UNIT
14: HOUSING
21: PIEZOELECTRIC FILM
22: ADHESIVE LAYER (FIRST ADHESIVE LAYER)
23: ADHESIVE LAYER (SECOND ADHESIVE LAYER)
28: ADHESIVE LAYER
24: PLATE ELECTRODE (FIRST PLATE ELECTRODE)
25: PLATE ELECTRODE (SECOND PLATE ELECTRODE)
26, 27: BASE MATERIAL LAYER
35a, 35b: SPACER
36: SUS PLATE (PLATE MEMBER)
37: PLUNGER

The invention claimed is:

1. A piezoelectric sensor comprising:
a piezoelectric film including first and second principal surfaces;
first and second plate electrodes;
a first adhesive layer which attaches the first plate electrode to the first principal surface;
a second adhesive layer which attaches the second plate electrode to the second principal surface; and
a plate member attached to the second plate electrode such that the second plate electrode and the second adhesive layer are interposed between the piezoelectric film and the plate member, the plate member constructed so as to be distorted when pressed, and the plate member, the piezoelectric film and the first and second plate electrodes are configured such that the distortion of the plate member produces charges on both the first and second principal surfaces of the piezoelectric film, and the charges are then induced in each of the first and second plate electrodes to detect a press of the plate member,
wherein the first adhesive layer is thicker than the second adhesive layer.

2. The piezoelectric sensor according to claim 1, wherein a thickness of the first adhesive layer is 40 µm or less.

3. The piezoelectric sensor according to claim 2, wherein a modulus of the first adhesive layer is lower than a modulus of the second adhesive layer.

4. The piezoelectric sensor according to claim 3, wherein a material of the first adhesive layer is an acrylic pressure sensitive adhesive.

5. The piezoelectric sensor according to claim 4, wherein the piezoelectric film is a chiral polymer.

6. The piezoelectric sensor according to claim 5, wherein the chiral polymer is polylactic acid.

7. The piezoelectric sensor according to claim 6, wherein the polylactic acid is poly-L-lactic acid.

8. The piezoelectric sensor according to claim 1, wherein the thickness of the first adhesive layer is 30 µm and a thickness of the second adhesive layer is 10 µm.

9. The piezoelectric sensor according to claim 1, wherein a modulus of the first adhesive layer is lower than a modulus of the second adhesive layer.

10. The piezoelectric sensor according to claim 9, wherein a material of the first adhesive layer is an acrylic pressure sensitive adhesive.

11. The piezoelectric sensor according to claim 10, wherein the piezoelectric film is a chiral polymer.

12. The piezoelectric sensor according to claim 11, wherein the chiral polymer is polylactic acid.

13. The piezoelectric sensor according to claim 12, wherein the polylactic acid is poly-L-lactic acid.

14. The piezoelectric sensor according to claim 1, wherein a material of the first adhesive layer is an acrylic pressure sensitive adhesive.

15. The piezoelectric sensor according to claim 14, wherein the piezoelectric film is a chiral polymer.

16. The piezoelectric sensor according to claim 15, wherein the chiral polymer is polylactic acid.

17. The piezoelectric sensor according to claim 16, wherein the polylactic acid is poly-L-lactic acid.

18. The piezoelectric sensor according to claim 1, wherein the piezoelectric film is a chiral polymer.

19. The piezoelectric sensor according to claim 18, wherein the chiral polymer is polylactic acid.

20. The piezoelectric sensor according to claim 19, wherein the polylactic acid is poly-L-lactic acid.

21. A piezoelectric sensor comprising:
- a piezoelectric film including first and second principal surfaces;
- first and second plate electrodes;
- a first adhesive layer which attaches the first plate electrode to the first principal surface;
- a second adhesive layer which attaches the second plate electrode to the second principal surface; and
- a plate member attached to the second plate electrode such that the second plate electrode and the second adhesive layer are interposed between the piezoelectric film and the plate member, the plate member constructed so as to be distorted when pressed,
- wherein a modulus of the first adhesive layer is lower than a modulus of the second adhesive layer.

* * * * *